(12) United States Patent
Xu et al.

(10) Patent No.: US 6,233,533 B1
(45) Date of Patent: May 15, 2001

(54) TURNING CENTER WITH INTEGRATED NON-CONTACT INSPECTION SYSTEM

(75) Inventors: Hong Xu, Charlotte; Donald Lee Burgoon, Gastonia, both of NC (US)

(73) Assignee: Performance Friction Corporation, Clover, SC (US)

( * ) Notice: Subject to any disclaimer, the term of this patent is extended or adjusted under 35 U.S.C. 154(b) by 0 days.

(21) Appl. No.: 09/090,087

(22) Filed: Jun. 4, 1998

(51) Int. Cl.[7] ............................... G06F 7/70; B60K 31/04
(52) U.S. Cl. ............................... 702/91; 702/91; 702/113; 702/168; 701/70
(58) Field of Search ........................... 702/91, 116, 113, 702/168, 150; 409/110, 130; 82/1.11, 112; 701/69, 1, 53–65; 709/232, 238; 700/231; 73/118.2, 118.1

(56) References Cited

U.S. PATENT DOCUMENTS

| | | |
|---|---|---|
| 4,290,510 | 9/1981 | Warren . |
| 4,457,172 | 7/1984 | Mathes . |
| 4,523,499 | 6/1985 | Aldridge, Jr. . |
| 4,669,046 | 5/1987 | Kubo . |
| 4,823,071 | 4/1989 | Ding et al. . |
| 4,899,218 | 2/1990 | Waldecker et al. . |
| 4,945,763 | 8/1990 | Mueller . |
| 5,046,361 | 9/1991 | Sandstrom . |
| 5,077,806 | 12/1991 | Peters et al. . |
| 5,125,187 | 6/1992 | Thiem . |
| 5,239,486 | 8/1993 | Mortier . |
| 5,327,782 | 7/1994 | Sato et al. . |
| 5,352,305 | 10/1994 | Hester . |
| 5,378,994 | 1/1995 | Novak et al. . |
| 5,485,678 | 1/1996 | Wagg et al. . |
| 5,566,244 | 10/1996 | Kato et al. . |
| 5,615,589 | 4/1997 | Roach . |
| 5,657,233 | 8/1997 | Cherrington et al. ................. 702/91 |
| 5,717,595 | 2/1998 | Cherrington et al. ................. 702/91 |
| 5,734,569 | 3/1998 | Rogers et al. ......................... 702/91 |

Primary Examiner—Kamini Shah
(74) Attorney, Agent, or Firm—Pillsbury Winthrop

(57) ABSTRACT

A non-contact inspection system has one or more pairs of non-contact sensors, pointing at the braking surfaces and a non-contact sensor pointing at the outer diameter of a disc. The non-contact sensors can be inductive sensors, capacitive probes and/or laser sensors. A controller is connected to each sensor for signal processing and measurement output. The system measures various features and characteristics, such as braking surface thickness variation, lateral run-out, flatness, parallelism and diameters. Measurements are made while the disc rotates at a specified speed or while the disc is stationary. The pairs of non-contact sensors continuously measure the distance from the sensor or calibrated surface to the pointed surface. Thereby the run-out and thickness variations can be calculated from the measurements at different radii. By combining the measurements on the same braking surface, the flatness and parallelism are calculated. The other two sensors continuously measure the distance from the sensor or the calibrated surface to the pointed surface. A diameter can be calculated knowing the center of the disc. The lateral run-out, thickness variation, flatness and parallelism can be measured on each brake disc within the turning center for final inspection and/or statistical process control. The diameter measurement and its run-out can be fed back to the turning center to monitor and compensate tool wear.

22 Claims, 4 Drawing Sheets

TURNING CENTER WITH INTEGRATED NON-CONTACT INSPECTION SYSTEM

FIELD OF THE INVENTION

This invention relates machining rotors and, more specifically, to a non-contact inspection system integrated with a turning center for machining rotatable brake rotors.

BACKGROUND OF THE INVENTION

Motor vehicles use various mechanisms to facilitate braking. Well known among these braking mechanisms is a combination of a disc rotor connected to a wheel of the vehicle. In order to stop or slow the vehicle, pressure is applied by a brake caliper clamping brake pads against one or more outer surfaces of the disc rotor (e.g., using so-called disc brakes), thereby slowing or stopping the rotation the wheel.

Some rotors have a veined construction. A typical veined rotor 100 is depicted in FIGS. 1 and 2, wherein FIG. 1 shows a front view and FIG. 2 shows a side view of the rotor 100. A portion of the rotor 100 (between the lines I and II) is cut away to show the inside veined structure of the rotor. The veined rotor essentially is made up of two disc plates separated and connected by a number of veins. The veins can be straight or curved and the number of veins varies from one rotor to another. For example, FIGS. 3 and 4 show an example of an unmachined veined rotor with curved veins. The rotor 100 has two outside surfaces 102, 104, these surfaces being provided by the outer surfaces of the two discs comprising the rotor. It is against these two surfaces 102, 104 that pressure is applied (e.g., by brake pads (not shown)) in order to slow or stop the rotation of the wheel drive connected to the rotor 100. Ideally, the rotor 100 is perfectly circular and these surfaces 102, 104 are parallel to each other.

A typical rotor 100 is manufactured by machining a pre-cast rotor. A cast, pre-machined rotor 106 is shown in FIGS. 5 and 6 which depict front and side views of the pre-cast, un-machined rotor 100, respectively. The rotor 100 shown in FIGS. 1 and 2 is produced by appropriately machining the cast rotor 106.

A number of problems or defects can exist with existing rotors, and some of these problems or defects can be traced back to the manner in which the rotors were machined. For example, as noted above, in order to prevent or avoid uneven wear and heat of the rotors surfaces, the two surfaces 102, 104 are ideally parallel. In prior machining systems, the parallelness of the two surfaces was not determined prior to machining. Further, after machining, it is desirable to minimize thickness variation (TV) and lateral run-out (LRO) of each rotor as well as to have a symmetric rotors. A summary of these problems can be found in "Using Capacitive Probes in Automotive Brake Component Testing," Steve Muldoon and Rick Sandberg, *Test Engineering & Management*, August/September 1997 (hereinafter "Muldoon"). Muldoon is hereby incorporated herein in its entirety by reference. Muldoon shows the use of non-contact capacitance probes in post-production brake testing.

SUMMARY OF THE INVENTION

It is desirable to produce brake rotors that are of superior quality and that do not suffer from the drawbacks of prior systems. It is therefore desirable to incorporate the non-contact inspection systems into a brake turning center so as to dynamically test and, when appropriate, alter the instructions to the center. In this manner, potential problems are caught during rather than after machining.

Accordingly, this invention solves the above and other problems by providing, in one aspect, a system, incorporated into a turning center, the system having pairs of non-contact sensors, pointing at the braking surfaces and a non-contact sensor pointing at the outer and/or inner diameters of the disc. The non-contact sensors can be inductive sensors, capacitive probes and/or laser sensors. A controller is connected to each sensor for signal processing and measurement output. Each sensor can be calibrated by a gauge block, master part or in any appropriate manner. The system can measure various features and characteristics, such as, but not limited to, braking surface thickness variation, lateral and/or radial run-out, flatness, parallelism and diameters and other appropriate and useful features.

Measurements are made while the disc rotates at a specified, known speed or is stationary. The one or more pairs of non-contact sensors continuously measure the distance from the sensor or calibrated surface to the pointed surface. Therefore the lateral and/or radial run-out and thickness variation can be calculated from the measurements at multiple (preferably three) different radii. By combining the measurements on the same braking surface, the flatness and parallelism can be calculated. The other two sensors continuously measure the distance from the sensor or the calibrated surface to the pointed surface. A diameter can be calculated knowing the center of the disc.

The lateral and/or radial run-out, thickness variation, flatness and parallelism can be measured on each brake disc within the turning center for final inspection and/or statistical process control. The diameter measurement and its run-out can be fed back to the turning center to monitor and compensate tool wear.

In another aspect, this invention is a method of machining a part mounted in a chuck of a computer-controlled turning system. The method includes positioning a plurality of non-contact sensors to point at the part; obtaining measurements from the sensors; calculating attributes of the part based on the measurements; and dynamically adjusting the clamping force of the chuck on the part based on the calculated attributes. The measurements can be obtained from the sensors while the part is mounted in the turning system or while the part is removed from the system.

In preferred embodiments, the part is a disc brake rotor and wherein the attributes include at least some of: braking surface thickness variation of the disc, lateral and/or radial run-out of the disc, flatness of the disc, and parallelism of the disc.

Preferably the non-contact sensors are selected from inductive sensors, capacitive probes and laser sensors.

In some embodiments other aspects of the machining center itself are measured. For example, the method can include measuring, while turning, at least some of: (a) the deflection of the rotor; (b) spindle movement and/or run-out; (c) chuck movement and/or run-out; (d) tool movement. These measurements can be used to adjust the clamping force of the chuck on the part based on the measured attributes.

BRIEF DESCRIPTION OF THE DRAWINGS

The above and other objects and advantages of the invention will be apparent upon consideration of the following detailed description, taken in conjunction with the accompanying drawings, in which the reference characters refer to like parts throughout and in which.

DETAILED DESCRIPTION OF THE PRESENTLY PREFERRED EXEMPLARY EMBODIMENTS

Figure 1:
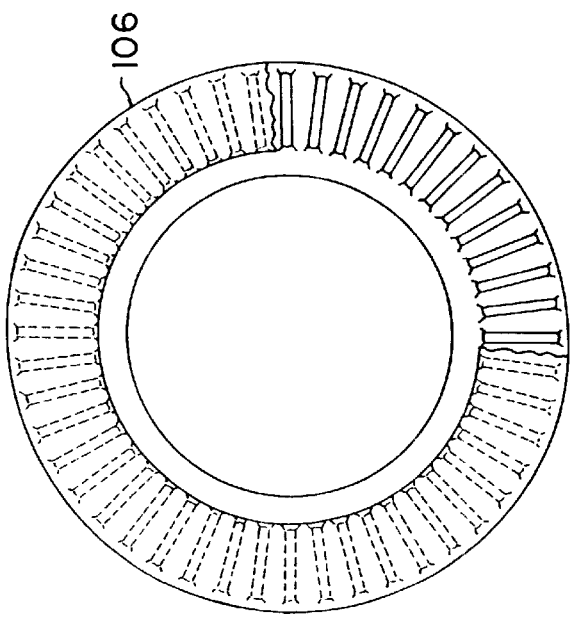
FIGS. 1 and 2 show typical rotors produced according to the present invention.
Figure 2:
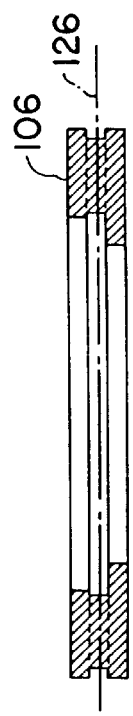
Figure 5:
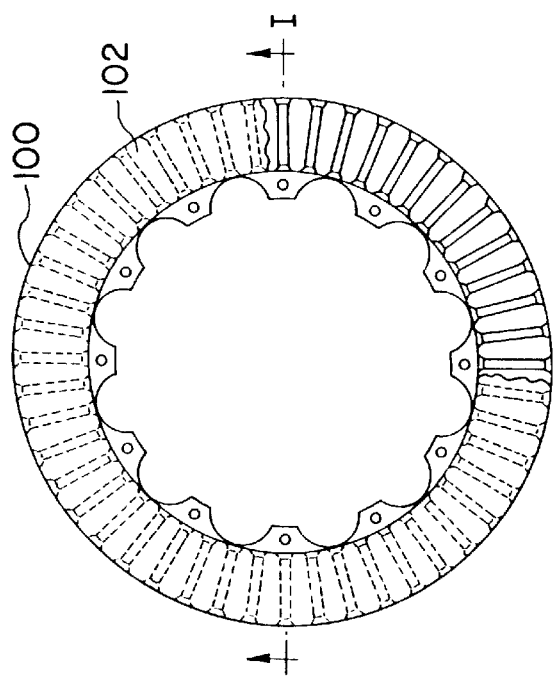
FIGS. 3 to 6 show castings used to produce rotors according to this invention.
Figure 6:
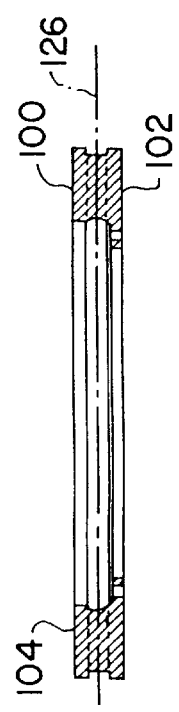
Figure 4:
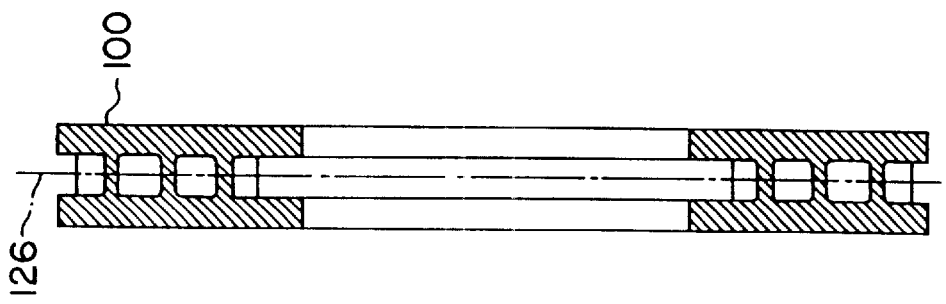
Figure 3:
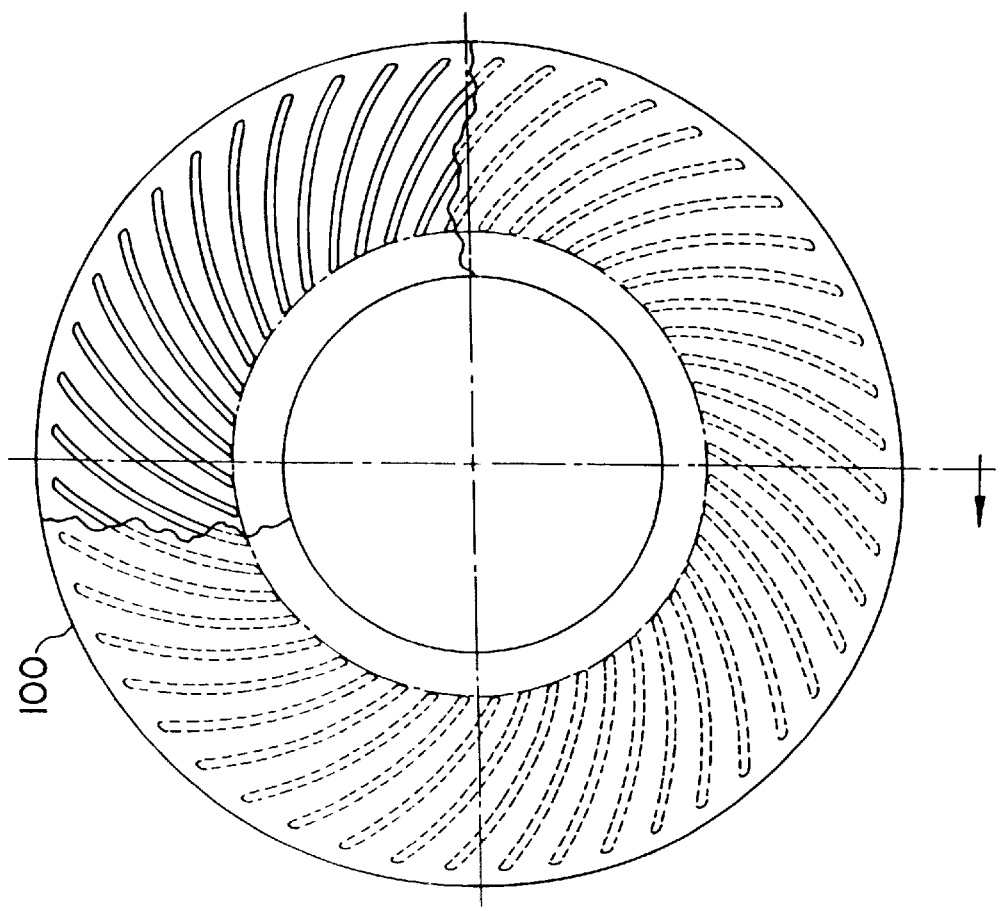
Figure 7:
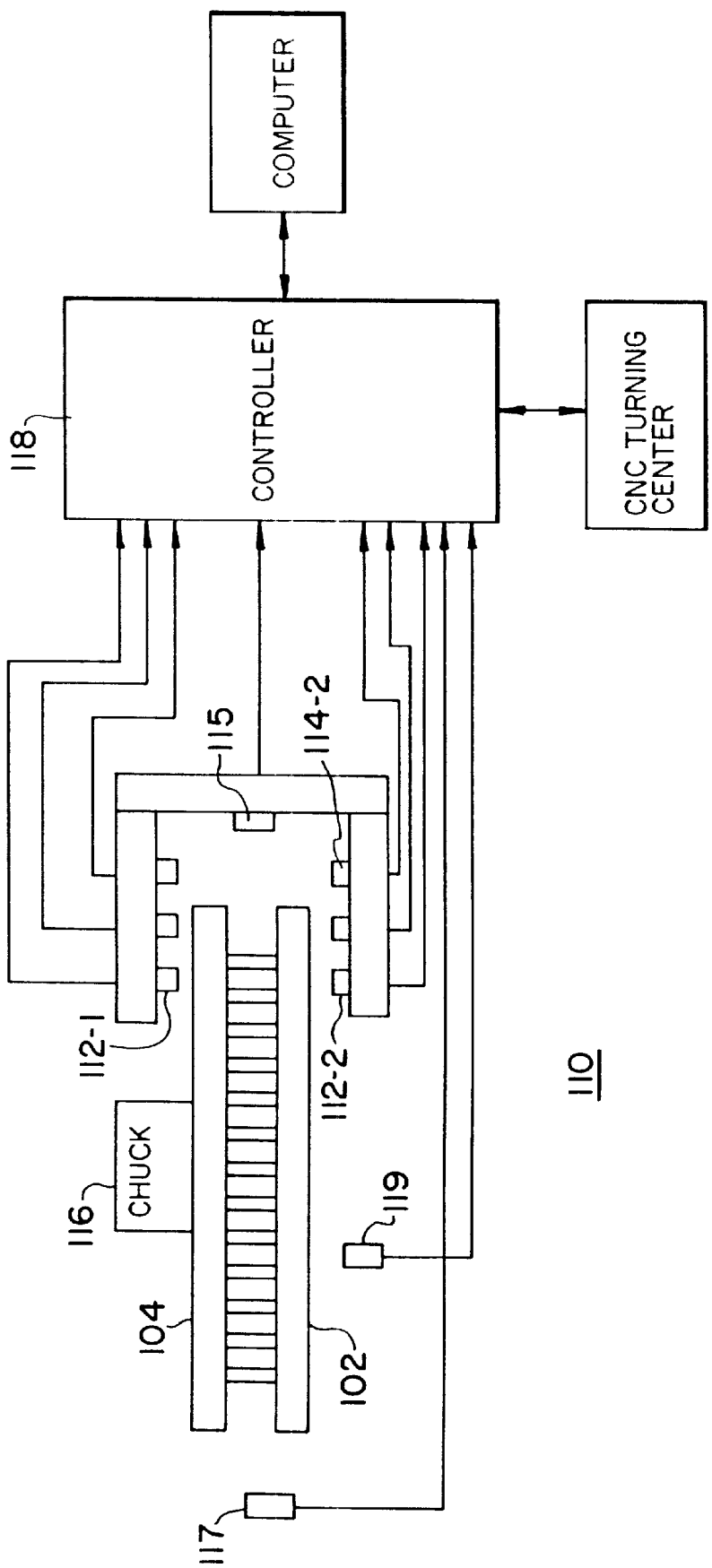
FIG. 7 show a machining system according to the present invention.

With reference to FIG. 7, a brake rotor 100 to be machined is mounted on a chuck 116 of the turning center 110. The rotor 100 can be any type of machined rotor, including, but not limited to hatted rotors, rotors with integral hubs, and combinations of these types of rotors. The system (turning center) 110 according to the presently preferred embodiment of the invention includes three pairs of on non-contact sensors 112-1, 112-2, 113-1, 113-2, 114-1 and 114-2, perpendicularly pointing a the braking surfaces 102, 104 of the rotor 100 mounted on the chuck 116. In other embodiments fewer sensors or more sensors can be used. Another non-contact sensor 115 (and/or 117) is directed to the outer diameter of the mounted rotor 100. A further non-contact sensor 119 is directed to the edge of the inner diameter of the rotor 100 to measure that diameter.

The non-contact sensors can be inductive sensors, capacitive probes and/or laser sensors. Each non-contact sensor is connected to a controller 118 for signal processing and for measurement of the sensor's output. Each sensor can be calibrated by a gauge block, a master part or in any other appropriate manner.

The system (turning center) 110 is adapted to dynamically measure various features and characteristics of the rotor 100. These features include, but are not limited to, braking surface thickness variation (TV), lateral run-out (LRO), radial run-out (RRO), flatness, parallelism and inner and outer diameters. In the case of a hatted rotor, the diameter and other features of the hat can also be measured. The measurements of the various features are made in a known manner, essentially by determining the distance of each sensor to the surface it is pointed at. By combining these measurements in a known manner, the various features and characteristics, for example, braking surface thickness variation, lateral and/or radial run-out, flatness, parallelism and diameters and other appropriate and useful features can be used by the CNC turning center to control machining of the rotor 100.

Measurements of the various features are made while the disc 100 rotates at a specified speed or while the disc is stationary. If the measurements are made while the disc is rotating, it is preferably rotating at a specified speed. The three pairs of non-contact sensors 112-1, 112-2, 113-1, 113-2, 114-1 and 114-2 continuously and dynamically measure the distance from each sensor, respectively, or calibrated surface to the surface at which they are respectively pointing.

Therefore, in the preferred embodiment having three pairs of sensors, the lateral and/or radial run-out and thickness variation as well as other characteristics can be calculated from the measurements at three different radii. By combining the measurements on the same braking surface, the flatness and parallelism can be calculated. The other two sensors 115, 117 continuously measure the distance from the sensor or the calibrated surface to the surface to which they respectively point, i.e., to the surface of the outer diameter of the disc 100. Knowing the center of the disc 100, these measurements (of the outer diameter) allow for the calculation of the diameter of the disc 100. Similarly, the sensor 119 continuously measures the distance from the sensor to the inner diameter of the disc 100, thereby allowing for calculation of the inner diameter of the disc.

In operation, the lateral and/or radial run-out, thickness variation, flatness and parallelism are measured on each brake disc within the turning center for final inspection and/or for statistical process control. The diameter measurements and its run-out are optionally fed back to the turning center to monitor and compensate tool wear.

Figure 8:
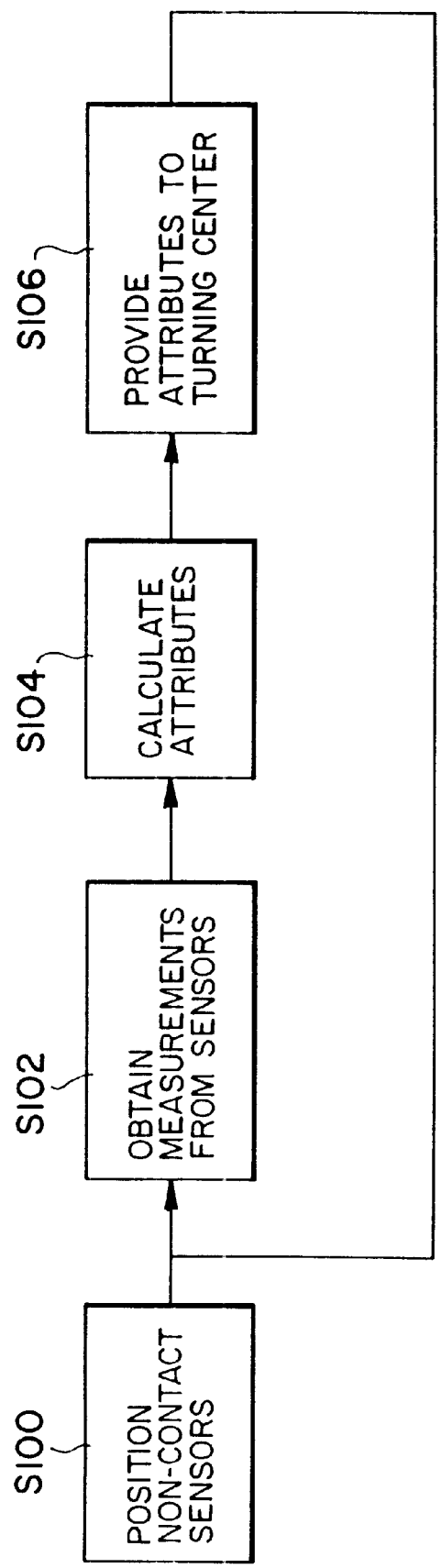
FIG. 8 is a flow chart of as aspect of this invention.

Thus, with reference to FIG. 8, the method of this invention includes positioning a plurality of non-contact sensors to point at outer surfaces of a disc (S100). Then measurements are obtained from the sensors (S102). Attributes of the disc are calculated based on the measurements (S104), and the calculated attributes are provided to the turning center (S106) for control of the machining of the disc. The process (S102, S104, S106) is repeated during the machining of the disc.

In another aspect of this invention, non-contact sensors are used to measure various features of the machining device itself. For example, sensors can be positioned to measure some or all of the following:

1. deflection of the part (rotor) while turning;
2. spindle movement and/or run-out while turning;
3. chuck movement and/or run-out while turning;
4. tool and tool holding movement while turning;
5. other features and characteristics of the tool or part being machined.

These features can be used, alone or along with the measurements of the actual part being machined, to dynamically control and adjust the turning center. In particular, they can be used to dynamically adjust the turning speed and cutting depth to minimize potential defects in the machined part. In yet another aspect of this invention, the measured values can be used to control the chuck clamping force, thereby using the minimal clamping force and reducing or preventing lobing of the rotor.

While the preferred embodiments have been described with respect to machining of disc brake rotors, machining of other parts is also contemplated by the inventors.

Thus, a turning center with integrated non-contact inspection system are provided. One skilled in the art will appreciate that the present invention can be practiced by other than the described embodiments, which are presented for purposes of illustration and not limitation, and the present invention is limited only by the claims that follow.

We claim:

1. A system including a computer-controlled turning center for machining a disc mounted on a chuck thereof, the center comprising:

a plurality of non-contact sensors positioned to point at outer surfaces of the disc;

a controller connected to the sensors and for dynamically obtaining measurements from the plurality of non-contact sensors; and a computer system for calculating attributes of the disc based on the measurements obtained by the controller and for providing the calculated attributes to the turning center for dynamic control of the machining of the disc.

2. A system as in claim 1 further comprising:

at least one non-contact sensor positioned to point at an outer diameter of the disc.

3. A system as in claim 1 wherein at least three pairs of non-contact sensors are provided.

4. A system as in claim 1 wherein the attributes include at least some of:

braking surface thickness variation of the disc, lateral run-out of the disc, radial run-out of the disc, flatness of the disc, parallelism of the disc, inner diameter of the disc, outer diameter of the disc, inner diameter of the hat of the disc, outer diameter of the hat of the disc, inner diameter of the hub of the disc, and outer diameter of the hub of the disc.

5. A system as in claim 2 wherein the attributes include at least some of:

braking surface thickness variation of the disc, lateral run-out of the disc, radial run-out of the disc, flatness of the disc, parallelism of the disc, inner diameter of the disc, outer diameter of the disc, inner diameter of the hat of the disc, outer diameter of the hat of the disc, inner diameter of the hub of the disc, outer diameter of the hub of the disc, and bearing rices.

6. A system as in any of claims 1–4 wherein the non-contact sensors are selected from inductive sensors, capacitive probes and laser sensors.

7. A system as in claim 5 wherein the non-contact sensors are selected from inductive sensors, capacitive probes and laser sensors.

8. A method of machining a disc mounted in a computer-controlled turning system, the method comprising:

positioning a plurality of non-contact sensors to point at outer surfaces of the disc;

dynamically obtaining measurements from the sensors;

calculating attributes of the disc based on the measurements; and providing the calculated attributes to the turning center for dynamic control of the machining of the disc.

9. A method as in claim 8 wherein the measurements are obtained from the sensors while the disc is mounted in the turning system.

10. A method as in claim 8 further comprising:

positioning at least one non-contact sensor to point at an outer diameter of the disc.

11. A method as in claim 8 wherein the attributes include at least some of:

braking surface thickness variation of the disc, lateral run-out of the disc, radial run-out of the disc, flatness of the disc, parallelism of the disc, inner diameter of the disc, outer diameter of the disc, inner diameter of the hat of the disc, outer diameter of the hat of the disc, inner diameter of the hub of the disc, outer diameter of the hub of the disc, and bearing rices.

12. A method as in claim 7 wherein the attributes include at least some of:

braking surface thickness variation of the disc, lateral run-out of the disc, radial run-out of the disc, flatness of the disc, parallelism of the disc, inner diameter of the disc, outer diameter of the disc, inner diameter of the hat of the disc, outer diameter of the hat of the disc, inner diameter of the hub of the disc, outer diameter of the hub of the disc, and bearing rices.

13. A method as in any one of claims 8–11 wherein the non-contact sensors are selected from inductive sensors, capacitive probes and laser sensors.

14. A method as in claim 12 wherein the non-contact sensors are selected from inductive sensors, capacitive probes and laser sensors.

15. A method as in claim 8 further comprising:

measuring, while turning, at least some of:

(a) the deflection of the rotor;

(b) spindle movement;

(c) spindle run-out;

(d) chuck movement;

(e) chuck run-out; and (f) tool movement.

16. A method as in claim 15 further comprising:

providing the measured values to the turning center for dynamic control of the machining of the disc.

17. A method of machining a part mounted in a chuck of a computer-controlled turning system, comprising:

positioning a plurality of non-contact sensors to point at the part;

dynamically obtaining measurements from the sensors;

calculating attributes of the part based on the measurements; and dynamically adjusting the clamping force of the chuck on the part based on the calculated attributes.

18. A method as in claim 17 wherein the measurements are obtained from the sensors while the part is mounted in the turning system.

19. A method as in claim 17 wherein the part is a disc brake rotor and wherein the attributes include at least some of:

braking surface thickness variation of the disc, lateral run-out of the disc, radial run-out of the disc, flatness of the disc, and parallelism of the disc.

20. A method as in any one of claims 17–19 wherein the non-contact sensors are selected from inductive sensors, capacitive probes and laser sensors.

21. A method as in claim 17 further comprising:

measuring, while turning, at least some of:

(a) the deflection of the rotor;

(b) spindle movement;

(c) spindle run-out;

(d) chuck movement;

(e) chuck run-out; and (f) tool movement.

22. A method as in claim 21 further comprising:

adjusting the clamping force of the chuck on the part based on the measured attributes.

* * * * *